(12) United States Patent
Ochiai

(10) Patent No.: US 6,509,805 B2
(45) Date of Patent: Jan. 21, 2003

(54) LC RESONANCE CIRCUIT AND VOLTAGE-CONTROLLED OSCILLATION CIRCUIT

(75) Inventor: Toshiyuki Ochiai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/810,663

(22) Filed: Mar. 19, 2001

(65) Prior Publication Data

US 2002/0014925 A1 Feb. 7, 2002

(30) Foreign Application Priority Data

Jul. 26, 2000 (JP) ........................................ 2000-225850

(51) Int. Cl.[7] .............................................. H03B 5/08
(52) U.S. Cl. .................................. 331/117 FE; 331/167
(58) Field of Search ............................ 331/167, 177 R, 331/177 V, 117 R, 117 FE, 177, 179

(56) References Cited

U.S. PATENT DOCUMENTS

| | | | | |
|---|---|---|---|---|
| 3,828,257 A | * | 8/1974 | Puskas ........................ 325/418 |
| 4,977,380 A | * | 12/1990 | Martin et al. ............ 331/117 R |
| 5,698,972 A | * | 12/1997 | Keeth ......................... 323/349 |
| 5,739,730 A | * | 4/1998 | Rotzoll .................... 331/177 V |
| 6,211,745 B1 | * | 4/2001 | Mucke et al. .............. 257/312 |
| 2002/0008593 A1 | * | 1/2002 | Gomez et al. .......... 331/117 FE |

FOREIGN PATENT DOCUMENTS

JP          07154231 A  *  6/1995   ......... H03K/19/003

OTHER PUBLICATIONS

R. Castello et al., *1999 VLSI Circuits*, (U.S.), "A ±30% Tuning Range Varactor Compatible with future Scaled Technologies" p. 34–35.

* cited by examiner

*Primary Examiner*—Robert Pascal
*Assistant Examiner*—Joseph Chang
(74) *Attorney, Agent, or Firm*—Norman N. Kunitz; Venable, LLP

(57) ABSTRACT

A control voltage Vin that has been input is sequentially reduced at NMOS's $11_1 \sim 11_3$ constituting means for voltage reduction. The individual voltages resulting from the voltage reduction are applied to control electrodes of MOS varactors $21_1 \sim 21_3$ constituting voltage-controlled variable-capacitance elements which are connected in parallel and, thus, the capacitance values of the individual MOS varactors $21_1 \sim 21_3$ are determined. An LC resonance circuit constituted of the MOS varactors $21_1 \sim 21_3$ and a coil 22 resonates at a specific frequency, NMOS's 23 and 24 constituting means for switching engage in on/off operation and oscillation occurs at an oscillation frequency corresponding to the voltage Vin resulting in an oscillation signal output through output terminals 3 and 4. Thus, an LC resonance circuit that allows the rate at which the capacitance values of the voltage-controlled variable-capacitance elements change to be set freely in correspondence to the particulars of design and a high-performance voltage-controlled oscillation circuit (VCO) that employs this LC resonance circuit and enables good control are provided.

18 Claims, 6 Drawing Sheets

LC RESONANCE CIRCUIT AND VOLTAGE-CONTROLLED OSCILLATION CIRCUIT

BACKGROUND OF THE INVENTION

1. Field of the Invention

The present invention relates to an LC resonance circuit that is formed as a semiconductor integrated circuit (hereafter referred to as an "IC") and the like and is provided with a voltage-controlled variable-capacitance element whose capacitance value changes in correspondence to the level of a control voltage and a voltage-controlled oscillation circuit (hereafter referred to as a "VCO") having this LC resonance circuit.

2. Description of the Related Art

The technologies related to VCOs having an LC resonance circuit in the prior art include that disclosed in the following publication.

Publication: 1999 VLSI Circuits, (U.S.) "A±30% Tuning Range Varactor Compatible with future Scaled Technologies" P. 34~35

The great progress made in the field of mobile wireless devices and the like in recent years has prompted extensive integration of high-frequency circuits to achieve miniaturization of the devices and a reduction in the power consumption.

A high-frequency circuit for a radio device often employs a VCO as the oscillations source. A VCO is an oscillation circuit whose oscillation frequency changes in correspondence to the level of the control voltage. A VCO manufactured as a MOS-IC for instance, is normally provided with an LC resonance circuit that employs a P/N junction type voltage-controlled variable-capacitance element (also referred to as a "P/N junction type varactor") or a MOS-type voltage-controlled variable-capacitance element (also referred to as a "MOS-type varactor") such as those disclosed in the publication mentioned above, to facilitate the IC manufacturing process.

As explained in the publication, a voltage-controlled variable-capacitance element employed in a VCO in the prior art operates by, in principle, using the change in capacitance between the anode electrode and the cathode electrode caused by changing the voltage applied to a P/N diode, or using the change in capacitance between the gate electrode of a MOS capacitor and the substrate caused by changing the gate voltage applied to the gate electrode of the MOS capacitor. Both of the voltage-controlled variable-capacitance elements pose problems in that since the capacitance changes drastically in correspondence to the change in the control voltage, a large amplitude cannot be set for the control voltage in conjunction with a VCO employing either type of the voltage-controlled variable-capacitance elements and in that the poor linearity of the output frequency relative to the control voltage results in control difficulties.

SUMMARY OF THE INVENTION

An object of the present invention is to provide a high-performance LC resonance circuit enabling good control, in which the rate at which the capacitance value of a voltage-controlled variable-capacitance element changes can be set freely in conformance to particulars of design and a VCO that employs this LC resonance circuit, by addressing the problems of the prior art discussed above.

In order to achieve the object described above, a first aspect of the present invention provides an LC resonance circuit comprising a coil connected between a first node and a second node, n (n is a positive integer equal to or larger than 2) variable-capacitance elements, each having a control electrode and connected in parallel between the first node and the second node with the capacitance value thereof caused to change in correspondence to a variable voltage applied to the control electrode, and m (m is a positive integer equal to or larger than 1) means for voltage reduction, each of which is connected to an input terminal at which a control voltage is input and provides a voltage achieved by lowering the control voltage to the control electrode of a respective one of the n variable-capacitance elements or one of (n−1) variable-capacitance elements.

In second and third aspects of the present invention, the variable-capacitance elements in the LC resonance circuit in the first aspect of the present invention are each constituted of a MOS-type varactor or a P/N junction type varactor.

In fourth~sixth aspects of the present invention, the means for voltage reduction in the LC resonance circuit in the first aspect of the present invention are each constituted of a MOS transistor which operates by using a forward voltage reduction occurring between a drain electrode and a source electrode in a diode connection in which a gate electrode and the drain electrode are shorted, a diode that operates by using a forward voltage reduction or a diode that operates by using a reverse breakdown voltage.

In the structure described above, the control voltage input to the input terminal is individually lowered by the m means for voltage reduction and the resulting reduced voltages are supplied to the control electrodes of the n variable-capacitance elements. The capacitance value of each variable-capacitance element is determined in conformance to the voltage supplied to its control electrode. Since the n variable-capacitance elements are connected in parallel, the value achieved by adding the individual capacitance values constitutes a combined capacitance value C. Since the coil is connected to the n variable-capacitance elements, the resonance frequency is expressed as f=1/(2πv(LC t)) with L representing the reactance value of the coil.

In seventh~twelfth aspects of the present invention, a VCO is provided with an LC resonance circuit in any of the first~sixth aspects of the invention. As a result, the capacitance values of the n variable-capacitance elements within the LC resonance circuit change as the control voltage input through the input terminal changes and, in correspondence to the changes in the capacitance values, the resonance frequency f (i.e., the oscillation frequency) changes.

BRIEF DESCRIPTION OF THE DRAWINGS

These and other advantages, features and objects of the present invention will be understood by those of ordinary skill in the art referring to the annexed drawings, given purely by way of non-limitative example, in which.

DETAILED DESCRIPTION OF THE PREFERRED EMBODIMENTS

Figure 2:
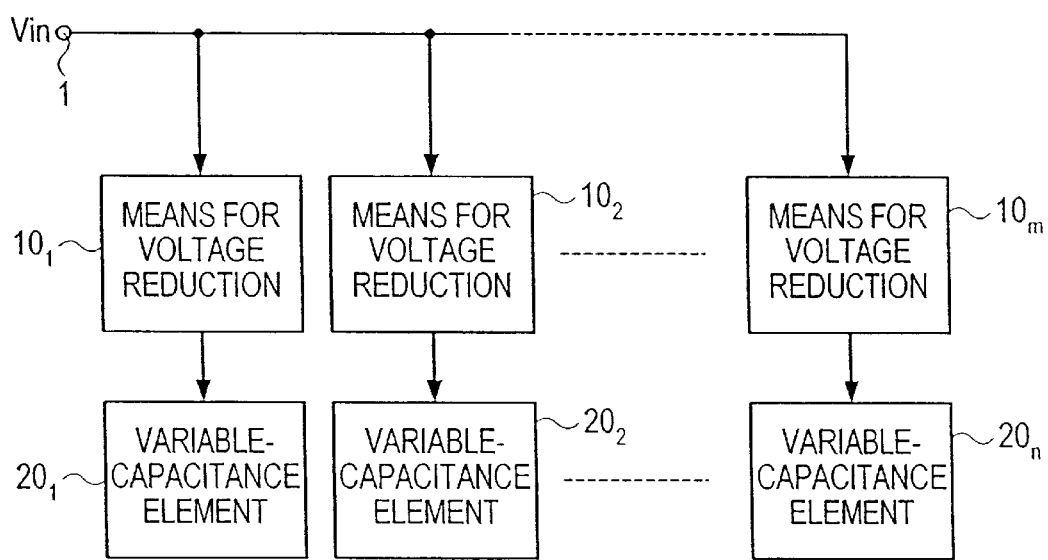
FIG. 2 is a block diagram that illustrates the principal adopted in embodiments of the present invention.

FIG. 2 is a block diagram provided to illustrate the principle applied in embodiments of the present invention.

In these embodiments, an input terminal 1 is provided, through which a control voltage Vin is input, with m (m is a positive integer equal to or larger than 1) means for voltage reduction $10_1 \sim 10_m$ connected to the input terminal 1. Control of electrodes of n (n is a positive integer equal to or larger than 2) variable-capacitance elements $20_1 \sim 20_n$ for voltage control are respectively connected to output terminals of the m means for voltage reduction $10_1 \sim 10_m$.

In this structure, when the control voltage Vin for varying the capacitance is input to the input terminal 1, the control voltage Vin undergoes a voltage reduction to achieve specific values at the individual means for voltage reduction $10_1 \sim 10_m$. The voltages resulting from the voltage reduction are input to the control electrodes of the individual variable-capacitance elements $20_1 \sim 20_n$ to determine the capacitance values of the variable-capacitance elements $20_1 \sim 20_n$.

Examples in which the structure shown in FIG. 2 is adopted in a VCO are now explained in reference to the first and second embodiments.

(First Embodiment)

Figure 1:
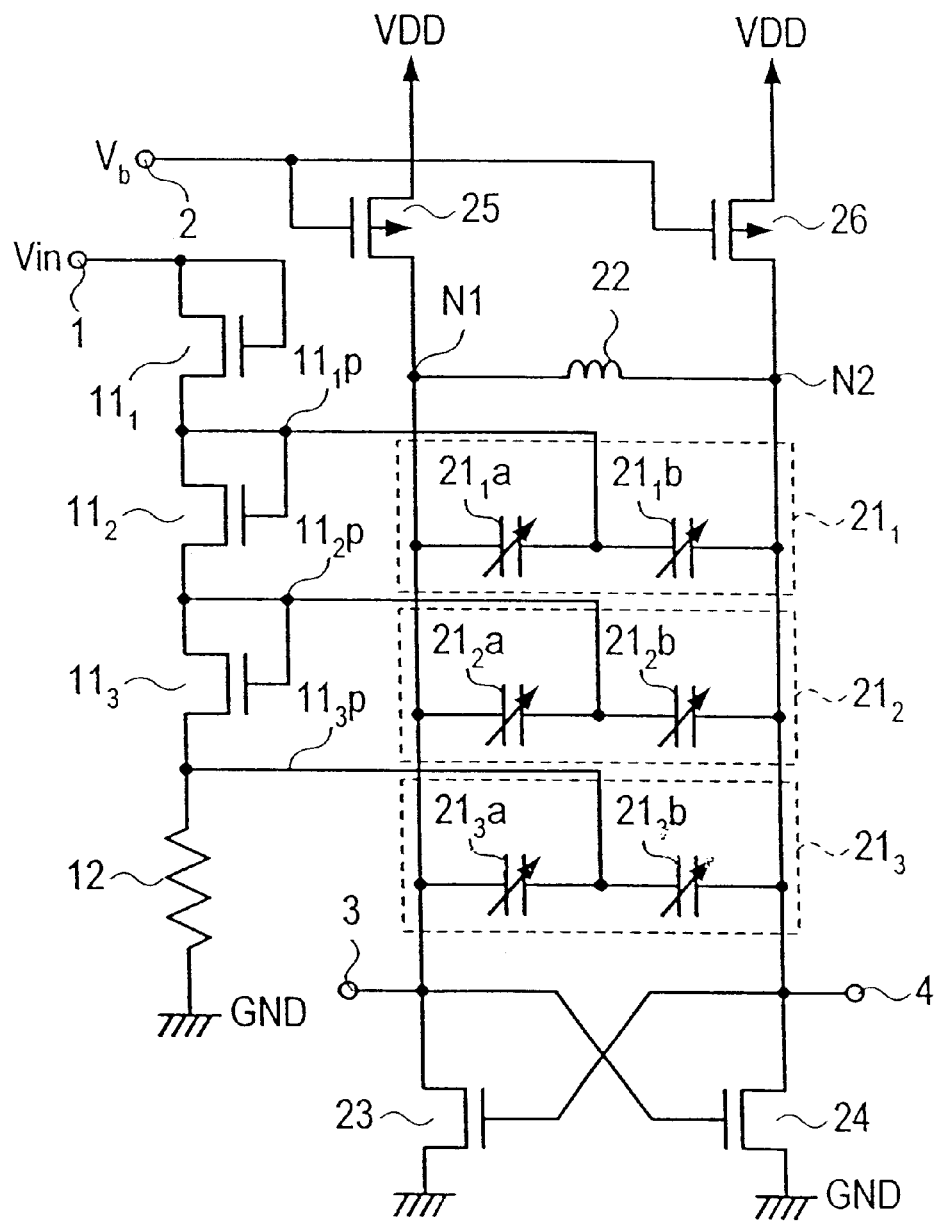
FIG. 1 is a circuit diagram of the differential VCO achieved in a first embodiment of the present invention.

FIG. 1 is a circuit diagram of a complementary MOS transistor (hereafter referred as "CMOS") type differential VCO achieved in the first embodiment of the present invention.

This CMOS differential VCO is provided with the input terminal 1 through which the control voltage Vin is input, a bias adjustment terminal 2 through which a bias voltage Vb is input, an inversion output terminal 3 and a non-inversion output terminal 4. m (e.g., 3) means for voltage reduction (e.g., diode-connected N-channel MOS transistors, hereafter referred to as "NMOS's" $11_1 \sim 11_3$ are connected in series with the input terminal 1. The source electrodes of the individual NMOS $11_1 \sim 11_3$ constitute output terminals $11_1 p \sim 11_3 p$. The output terminal $11_3 p$ of the NMOS $11_3$ is connected to the ground (hereafter referred to as "GND") via a resistor 12.

n (e.g., 3) variable-capacitance elements (e.g., MOS varactors $21_1 \sim 21_3$ are connected in parallel between a first node N1 and a second node N2. The MOS varactor $21_1$ is constituted of two MOS varactors $21_1 a$ and $21_1 b$ that are connected in series. Likewise, the MOS varactor $20_2$ is constituted of two MOS varactors $21_2 a$ and $21_2 b$ that are connected in series and the MOS varactor $21_3$ is constituted of two MOS varactors $21_3 a$ and $21_3 b$ that are connected in series. Control electrodes of the MOS varactors $21_1 \sim 21_3$ are respectively connected to the output terminals $11_1 p \sim 11_3 p$ of the NMOS's $11_1 \sim 11_3$. In addition, a coil 22 is connected between the first node N1 and the second node N2, and the coil 22 and the MOS varactors $21_1 \sim 21_3$ constitute an LC resonance circuit.

The first node N1 is connected with the inversion output terminal 3, whereas the second node N2 is connected to the non-inversion output terminal 4. The inversion output terminal 3 is connected to a drain electrode of a switching NMOS 23, with a source electrode and a gate electrode of the NMOS 23 respectively connected to the GND and the non-inversion output terminal 4. A drain electrode of a switching NMOS 24 is connected to the non-inversion output terminal 4, with a source electrode and a gate electrode of the NMOS 24 respectively connected to the GND and the inversion output terminal 3.

A drain electrode of a P-channel type MOS transistor 26 (hereafter referred to as a "PMOS") provided as a constant current source is connected to the first node N1, with a source electrode and a gate electrode of the PMOS respectively connected to a source VDD and the bias adjustment terminal 2. In addition, a drain electrode of a PMOS 26 provided as a constant current source is connected to the second node N2, with a source electrode and a gate electrode of the PMOS 26 respectively connected to the source VDD and the bias adjustment terminal 2. The operating points of the PMOS's 25 and 26 are controlled based upon the bias voltage Vb input to the bias adjustment terminal 2.

Next, the operation of the VCO shown in FIG. 1 is explained.

When the control voltage Vin is input to the input terminal 1, the control voltage Vin is sequentially lowered by the serially connected NMOS's $11_1 \sim 11_3$. For instance, when the NMOS's $11_1 \sim 11_3$ are transistors that are physically identical to one another and Vd represents the forward voltage reduction occurring in one of them, voltages Vin–Vd, Vin$_2$Vd and Vin$_3$Vd are respectively achieved at the output terminals $11_1 p \sim 11_1 p$ by setting an appropriate value at the resistor 12 for the NMOS's $11_1 \sim 11_3$ to operate. As a result, the voltages, the levels of which are sequentially shifted by the voltage Vd, are applied to the control electrodes of the individual MOS varactors $21_1 \sim 21_3$. Thus, capacitance values C $21_1$, C $21_2$ and C $21_3$ of the MOS varactors $21_1 \sim 21_3$ are determined. Since the MOS varactors with the capacitance values C $21_1$, C $21_2$ and C $21_3$ are connected in parallel, the combined capacitance value is expressed as Ct=C $21_1$+C $21_2$+C $21_3$.

When the inversion output terminal 3 is set to "H" level and the non-inversion output terminal 4 is set to "L" level by applying a voltage from the source VDD, for instance, the NMOS 24 is set in an ON state and the NMOS 23 is set in an OFF state. With the NMOS 24 set in an ON state, the source current flows from the source VDD to the GND via the PMOS 26, the second node N2 and the NMOS 24. This source current resonates the LC resonance circuit constituted of the MOS varactors $21_1 \sim 21_3$ and the coil 22, thereby setting the inversion output terminal 3 to "L" level and the non-inversion output terminal 4 to "H" level. As a result, the NMOS 23 enters an ON state and the NMOS 24 enters an OFF state. With the NMOS 23 set in an ON state, the source current flows from the source VDD to the GND via the PMOS 25, the first node N1 and the PMOS 23. This source current resonates the LC resonance circuit, thereby inverting the potentials at the inversion output terminal 3 and the non-inversion output terminal 4. The VCO oscillates through the operation described above.

The VCO oscillates at an oscillation frequency f=1/($2\pi\sqrt{(LCt)}$) with L representing the reactance value of the coil 22, and outputs the resulting oscillation signal through the inversion output terminal 3 and the non-inversion output terminal 4. Since the voltages input to the control electrodes of the individual MOS varactors $21_1 \sim 21_3$ also change as the control voltage Vin input to the input terminal 1 changes, the capacitance values C $21_1$, C $21_2$ and C $21_3$ of the MOS varactors $21_1 \sim 21_3$, too, are caused to change, resulting in a change in the oscillation frequency f.

Figure 3A:
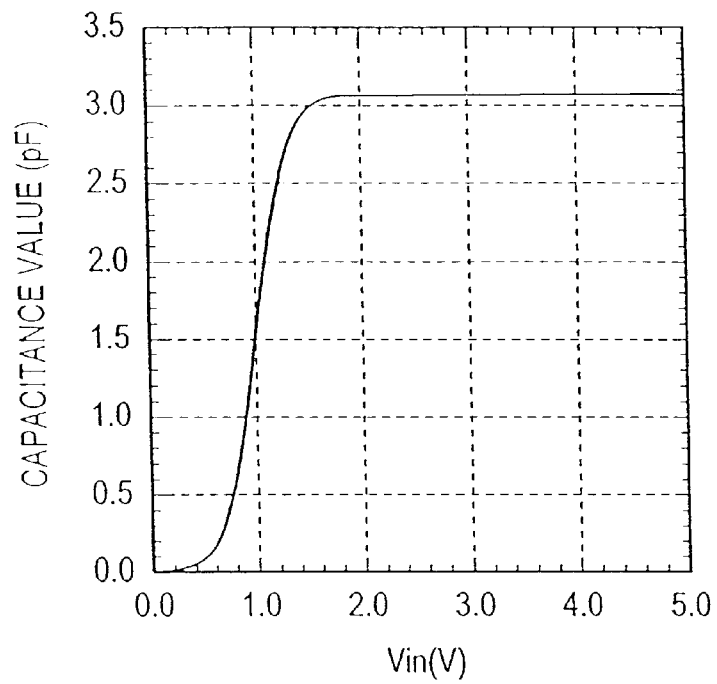
FIG. 3 presents the results of a simulation implemented in the first embodiment of the present invention.
Figure 3B:
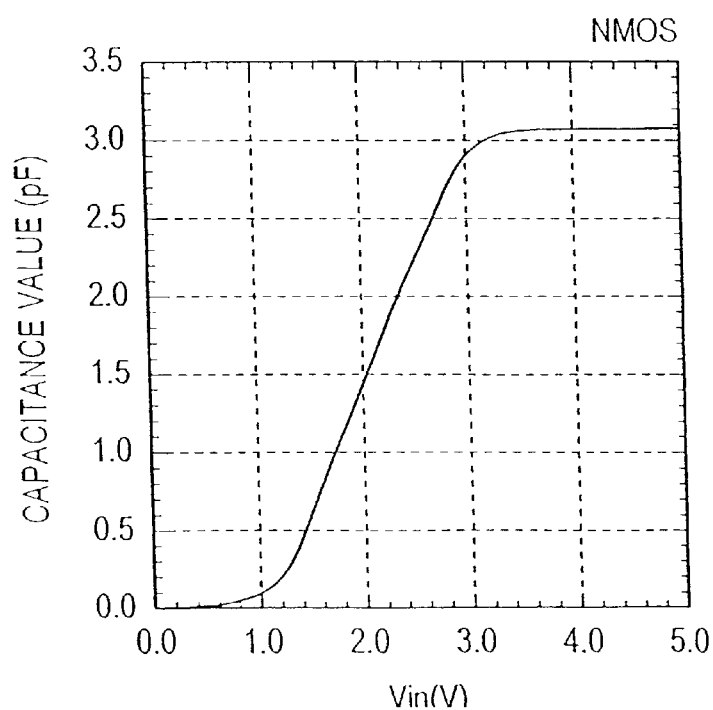

FIGS. 3(a) and 3(b) present the results of simulations implemented in the first embodiment of the present invention, with FIG. 3(a) showing the capacitance value-voltage value characteristics (i.e., C-V characteristics) achieved when the levels of the voltages at the output terminals $11_1 p \sim 11_3 b$ are the same and FIG. 3(b) representing the C-V characteristics achieved in the embodiment. The following is an explanation of advantages achieved in the embodiment, given in reference to FIGS. 3(a) and 3(b).

For comparison with the results achieved in the embodiment, the results achieved by applying the same control voltage Vin to the output terminals $11_1p{\sim}11_3p$ in FIG. 1 is explained. As the C-V characteristics in FIG. 3(a) indicate, the range of the control voltage Vin over which good linearity is achieved with respect to the inputs and the outputs of the MOS varactors $21_1{\sim}21_3$, is approximately 0.8~1.3 V, or approximately 0.5 V.

By conducting a simulation using the VCO shown in FIG. 1 achieved in the embodiment by setting the gate length and the gate width of the NMOS's $11_1{\sim}11_3$ respectively to 3 $\mu$m and 20 $\mu$m and setting the resistance value at the resistor 12 at 100 k$\Omega$, the results shown in FIG. 3(b) are achieved with regard to the changes in the capacitance values of the MOS varactors $21_1{\sim}21_3$ relative to the control voltage Vin. As FIG. 3(b) clearly indicates, the range over which good linearity is achieved with respect to the inputs and outputs is approximately 1.2~2.9 V, or approximately 1.7 V, and thus, linearity that is three times better than that in FIG. 3(a) presenting the results achieved without adopting the embodiment is realized.

Consequently, since the rates at which the capacitance values at the MOS varactors $21_1{\sim}21_3$ change can be set freely in correspondence to the particulars of design by adopting the embodiment, a high-performance VCO that enables good control is provided.

(Second Embodiment)

Figure 4:
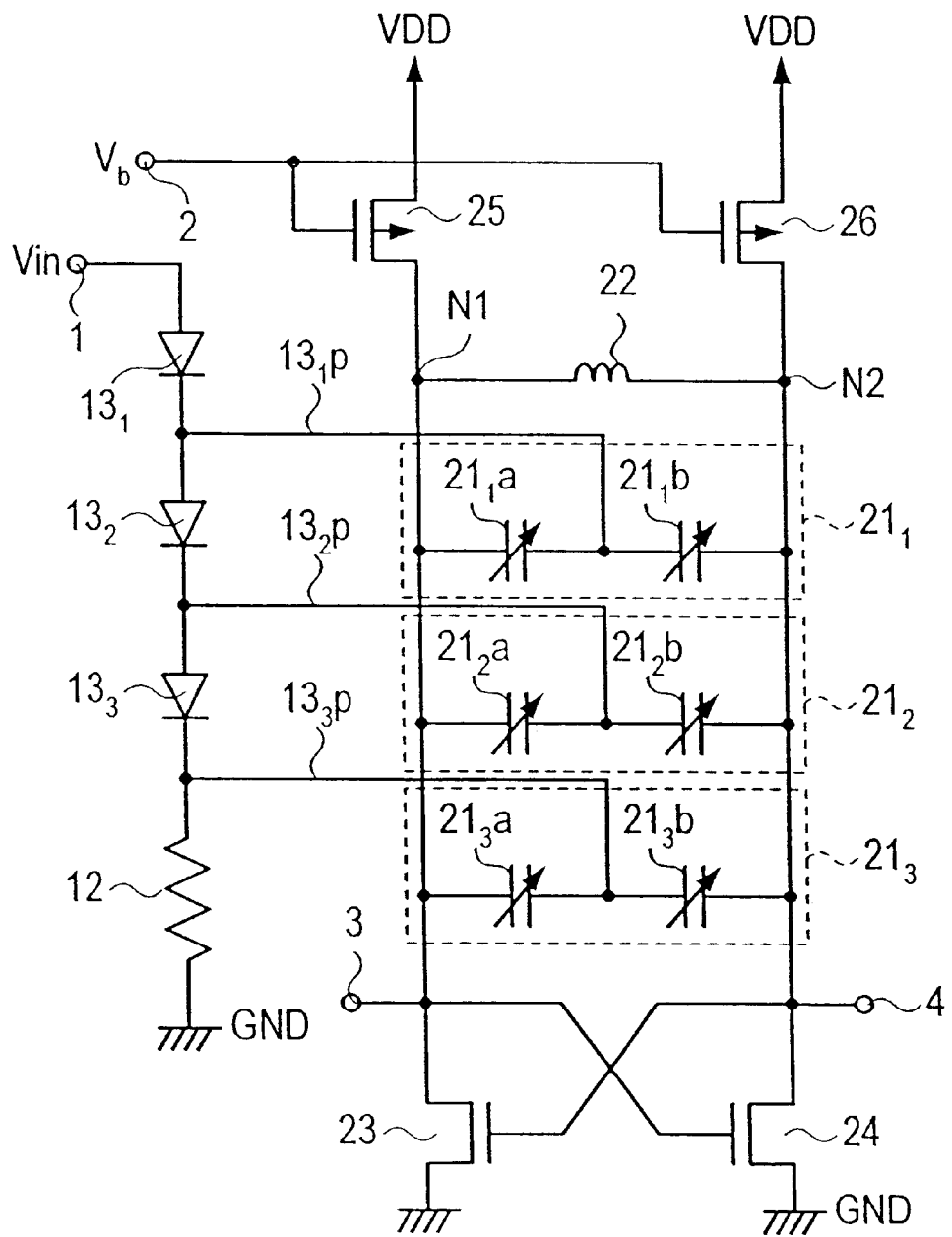
FIG. 4 is a circuit diagram of the differential VCO achieved in a second embodiment of the present invention.

FIG. 4 is a circuit diagram of the CMOS differential VCO achieved in the second embodiment of the present invention, with the same reference numbers assigned to elements identical to those in FIG. 1 illustrating the first embodiment.

In this CMOS differential VCO, the m means for voltage reduction are constituted of, for instance, one of three serially connected diodes $13_1{\sim}13_3$ that engage in operation by using forward voltage reduction. Namely, the three diodes $13_1{\sim}13_3$ are connected serially in the forward direction to the input terminal 1, with a cathode electrode of the diode $13_3$ connected to the GND via the resistor 12. Output terminals $13_1p{\sim}13_3p$ of the individual diodes $13_1{\sim}13_3$ located toward the cathode electrodes are respectively connected to the control electrodes of the MOS varactors $21_1{\sim}21_3$. Other structural features are identical to those adopted in the first embodiment illustrated in FIG. 1.

Next, the operation of the VCO shown in FIG. 4 is explained.

When the control voltage Vin is input to the input terminal 1, the control voltage Vin is sequentially lowered by the serially connected diodes $13_1{\sim}13_3$. For instance, when the diodes $13_1{\sim}13_3$ are diodes that are physically identical to one another and Vd represents the forward voltage reduction occurring in one of them, voltages Vin−Vd, Vin−2Vd and Vin−3Vd are respectively achieved at the output terminals $13_1p{\sim}13_3p$ by setting an appropriate value at the resistor 12 for the diodes $13_1{\sim}13_3$ to operate. As a result, the voltages, the levels of which are sequentially shifted by the voltage Vd are applied to the control electrodes of the individual MOS varactors $21_1{\sim}21_3$. Thus, capacitance values C $21_1$, C $21_2$ and C $21_3$ of the MOS varactors $21_1{\sim}21_3$ are determined.

As a result, as in the first embodiment, the LC resonance circuit constituted of the MOS varactors $21_1{\sim}21_3$ and the coil 22 resonate, and an oscillation occurs at the oscillation frequency corresponding to the control voltage Vin, resulting in an oscillation signal output through the output terminals 3 and 4.

Figure 5A:
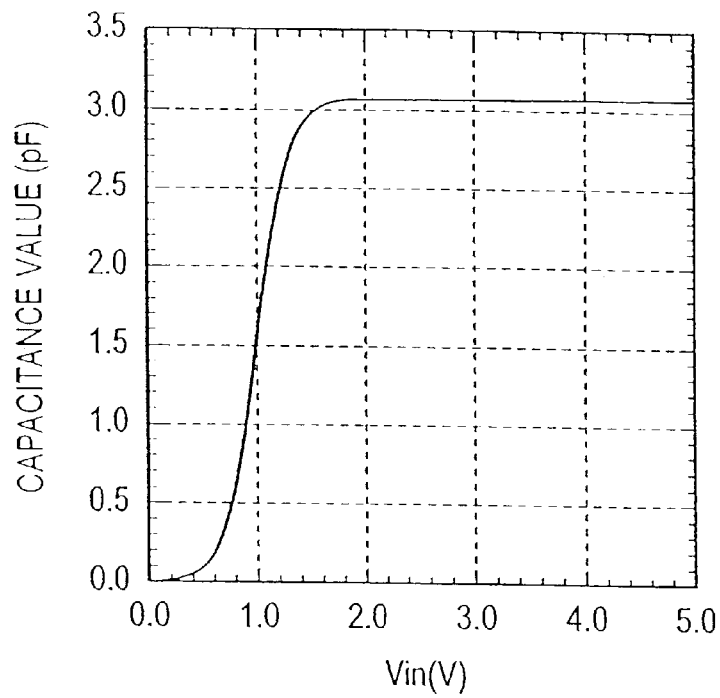
FIG. 5 presents the results of a simulation implemented in the second embodiment of the present invention.
Figure 5B:
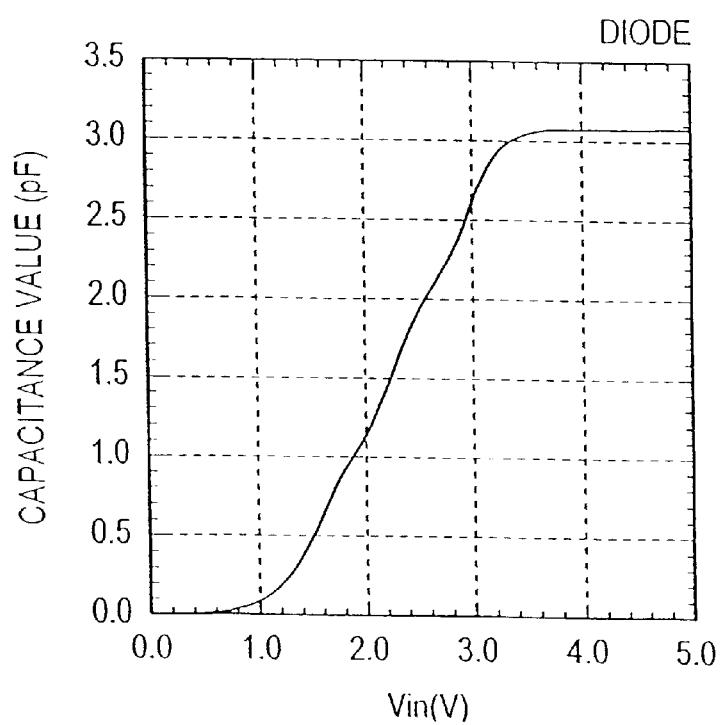

FIGS. 5(a) and 5(b) present the results of simulation implemented in the second embodiment of the present invention, with FIG. 5(a) showing the C-V characteristics achieved when the levels of the voltages at the output terminals $13_1p{\sim}13_3b$ are the same and FIG. 5(b) representing the C-V characteristics achieved in the embodiment. The following is an explanation of advantages achieved in the embodiment, given in reference to FIGS. 5(a) and 5(b).

For instance, if the same control voltage Vin is applied to the control electrodes of the individual MOS varactors $21_1{\sim}21_3$, the range of the control voltage Vin over which good linearity is achieved with respect to the inputs and the outputs of the MOS varactors $21_1{\sim}21_3$, is approximately 0.8~1.3 V, or approximately 0.5 V.

By conducting a simulation using the VCO achieved in the embodiment by constituting each of the diodes $13_1{\sim}13_3$ with a P/N junction diode and setting the resistance value at the resistor 12 at 1 k$\Omega$, the results shown in FIG. 5(b) are achieved with regard to the changes in the capacitance values of the MOS varactors $21_1{\sim}21_3$ relative to the control voltage Vin. As FIG. 5(b) clearly indicates, the range over which good linearity is achieved with respect to the inputs and the outputs is approximately 1.2~3.2 V, or approximately 2.0 V, and thus, linearity that is four times better than the results achieved without adopting the embodiment is realized.

As a result, a VCO that enables better control compared to that in the first embodiment, is realized.

(Utilization Modes)

It is to be noted that the present invention is not limited to the particulars of the embodiments described above and it allows for numerous variations and utilization modes. Such variations and utilization modes include (1)~(4) described below.

(1) Variations of FIG. 1

While the NMOS's $11_1{\sim}11_3$ having a gate length of 3 $\mu$m and a gate width of 20 $\mu$m are used to constitute the means for voltage reduction and the resistor 12 connected to them achieves a resistance value of 100 k$\Omega$, the dimensional values and the resistance value are not limited to these examples and they may be selected freely in correspondence to the particulars of design. In addition, instead of constituting the means for voltage reduction with the NMOS's $11_1{\sim}11_3$, they may be each constituted of a plurality of serially connected transistors.

Furthermore, while FIG. 1 presents an example in which three MOS varactors $21_1{\sim}21_3$ are used, the voltage control range may be expanded by increasing the number of variable-capacitance elements that are connected in parallel and likewise increasing number of stages of NMOS's $11_1{\sim}11_3$ constituting the means for voltage reduction in accordance.

(2) Variations of FIG. 4

Figure 6:
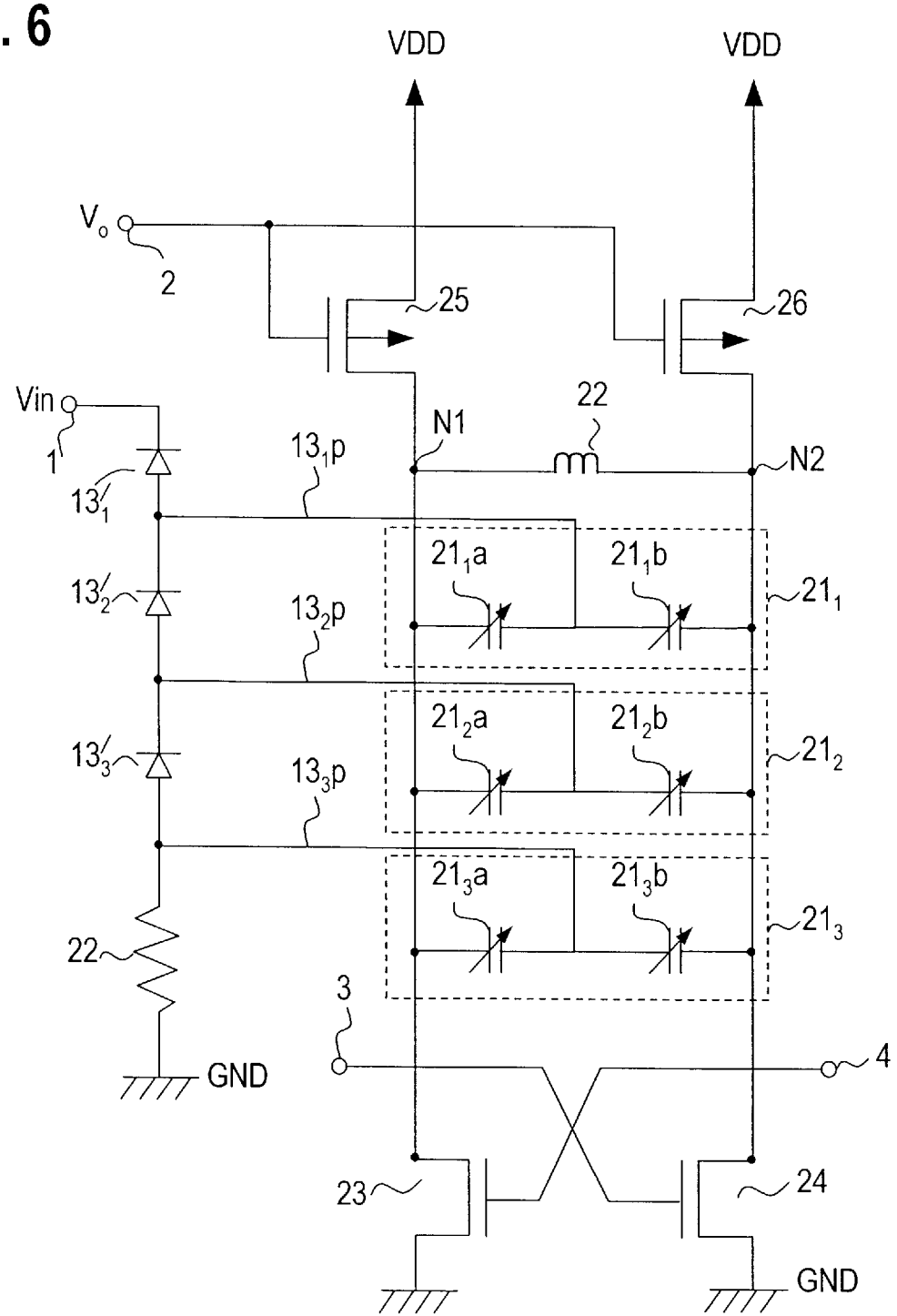
FIG. 6 is a circuit diagram of a modification of the differential VCO according to FIG. 4.

While the P/N junction diodes $13_1{\sim}13_3$ are employed and the resistance value of the resistor 12 connected to them is set at 1 k$\Omega$ in FIG. 4, the present invention is not restricted by these examples and the type of diodes and the resistance value may be selected freely in correspondence to the particulars of design. In addition, instead of constituting the means for voltage reduction with the diodes $13_1{\sim}13_3$, the means for voltage reduction may be each constituted of a plurality of diodes that are serially connected. Furthermore, while forward voltage reduction occurring at the diodes $13_1{\sim}13_3$ are utilized in the example in FIG. 4, reverse breakdown voltages achieved by reversing the direction in which the diodes are connected may be used instead, to achieve advantages similar to those realized the structure shown in FIG. 4. Such an arrangement is shown in FIG. 6.

While FIG. 4 presents an example in which three MOS varactors $21_1\sim21_3$ are used, the voltage control range may be expanded by increasing the number of variable-capacitance elements that are connected in parallel and likewise increasing the number of stages of diodes constituting the means for voltage reduction in accordance.

(3) Utilization Modes that May Be Adopted in Conjunction with FIGS. 1 and 4

In FIGS. 1 and 4, the NMOS $11_1$ and the diode $13_1$, each constituting the means for voltage reduction at the first stage, may be omitted and a control voltage Vin which has been adjusted may be directly applied to the control electrode of the MOS varactor $21_1$. Since the means for voltage reduction at the first stage is omitted, the circuit structure is simplified.

While an explanation is given in reference to FIGS. 1 and 4, on the present invention adopted in a CMOS differential VCO, it goes without saying that the present invention may be adopted in all types of VCO's (e.g., Hartly VCO's and Colpitts VCO's) that employ an LC resonance circuit and adopt a structure in which the oscillation frequency is varied by changing the capacitance value of the LC resonance circuit.

In addition, while an explanation is given above of an example in which the MOS varactors $21_1\sim21_3$ constitute variable-capacitance elements, the present invention is not limited to this example and P/N junction type varactors may be employed instead to achieve similar functions and advantages. While three variable-capacitance elements are connected in parallel in the examples presented in FIGS. 1 and 4, the number of variable-capacitance elements is not limited to this example and any number of variable-capacitance elements may be connected in conformance to the particulars of design. In addition, the individual variable-capacitance elements do not need to have the same capacitance value as in the case of the examples shown in FIGS. 1 and 4, and their capacitance values may be individually set in correspondence to the particulars of design. However, it is to be borne in mind that the value of the combined capacitance achieved through the parallel connection matches the desired resonance frequency.

Furthermore, while the individual NMOS's $11_1\sim11_3$ or the individual diodes $13_1\sim13_3$ constituting the means for voltage reduction have identical characteristics in the example shown in FIG. 1 or 4, elements having different dimensions, different forward voltage reductions Vd and different reverse breakdown voltages may be utilized to constitute the means for voltage reduction, to satisfy specific design requirements. While each means for voltage reduction is constituted of a single element in the examples presented in FIGS. 1 and 4, the present invention is not limited by these details and a plurality of elements may be connected in series to constitute a means for voltage reduction in conformance to specific design requirements. However, since the relationship under which the variable range of the capacitance values changes relative to the control voltage Vin is determined by selecting appropriate variable-capacitance value ranges for the individual variable capacitance elements and appropriate values by which the voltage becomes lowered at the individual means for voltage reduction regardless of what specific combination of elements is adopted, a combination should be selected in correspondence to the required C-V characteristics.

As explained above in detail, according to the present invention in the first~sixth aspects having a coil, n variable-capacitance elements and m means for voltage reduction, the rate at which the capacitance values change at the variable-capacitance elements can be set freely in correspondence to the particulars of design.

According to the present invention in the seventh~twelfth aspects provided with any of the LC resonance circuits achieved in the first~sixth aspects, a high-performance VCO that enables good control is achieved.

What is claimed is:

1. An LC resonance circuit comprising;

a coil connected between a first node and a second node;

n (n is a positive integer equal to or larger than 2) variable-capacitance elements, each having a control electrode and connected in parallel between said first node and said second node with the capacitance value thereof caused to change in correspondence to a variable voltage applied to said control electrode; and m (m is a positive integer equal to or larger than 1) voltage reduction circuits connected in series to an input terminal at which a control voltage is input and each providing a voltage at a respective output achieved by lowering the control voltage at its respective input, and each respective output of a voltage reduction circuit being connected to a respective said control electrode of one of said n variable-capacitance elements or one of (n-1) variable-capacitance elements.

2. An LC resonance circuit according to claim 1, wherein:

said variable-capacitance elements are each constituted of a MOS varactor.

3. An LC resonance circuit according to claim 1, wherein:

said variable-capacitance elements are each constituted of a P/N junction type varactor.

4. An LC resonance circuit according to claim 1, wherein:

said voltage reduction circuits are each constituted of a MOS transistor that operates by using a forward voltage reduction occurring between a drain electrode and a source electrode in a diode connection achieved by shorting a gate electrode and said drain electrode.

5. An LC resonance circuit according to claim 1, wherein:

said voltage reduction circuits are each constituted of a diode that operates by using a forward voltage reduction electrodes of the diode.

6. An LC resonance circuit according to claim 1, wherein:

said voltage reduction circuits are each constituted of a diode that operates by using a reverse breakdown voltage occurring between electrodes of the diode.

7. An LC resonance circuit according to claim 1, wherein said input terminal is connected via one of said voltage reduction circuits to a control electrode of one of said variable capacitance elements.

8. An LC circuit according to claim 1 wherein each of said variable capacitance elements comprises first variable capacitance connected in series with a second variable capacitance, and with the control electrode connected at a common connection of said first capacitance and said second capacitance.

9. An LC circuit according to claim 1, wherein said series connected voltage reduction circuits are connected at an input end to said input terminal and at an output end via a series resistor to a point of reference potential.

10. A voltage-controlled oscillation circuit having an LC resonance circuit, comprising;

a coil connected between a first node and a second node;

n (n is a positive integer equal to or larger than 2) variable-capacitance elements, each having a control electrode and connected in parallel between said first node and said second node with the capacitance value thereof caused to change in correspondence to a variable voltage applied to said control electrode;

m (m is a positive integer equal to or larger than 1) voltage reduction circuits connected in series to an input terminal at which a control voltage is input such that each voltage reduction circuit provides a respective control voltage achieved by a progressive lowering of the control voltage at said input terminal and each said respective voltage being applied to said control electrode of a respective one of said n variable-capacitance elements or one of (n−1) variable-capacitance elements.

a first transistor connected between said first node and ground and having a gate connected to said second node; and a second transistor connected between said second node and ground, and having a gate connected to said first node.

11. A voltage-controlled oscillation circuit according to claim 10, wherein:

said variable-capacitance elements are each constituted of a MOS varactor.

12. A voltage-controlled oscillation circuit according to claim 10, wherein:

said variable-capacitance elements are each constituted of a P/N junction type varactor.

13. A voltage-controlled oscillation circuit according to claim 10, wherein:

said voltage reduction circuits are each constituted of a MOS transistor that operates by using a forward voltage reduction occurring between electrodes of the diode.

14. A voltage-controlled oscillation circuit according to claim 10, wherein:

said voltage reduction circuits are each constituted of a diode that operates by using a forward voltage reduction occurring between electrodes of the diode.

15. A voltage-controlled oscillation circuit according to claim 10, wherein:

said means for voltage reduction are each constituted of a diode that operates by using a reverse breakdown voltage of the diode.

16. A voltage-controlled oscillation circuit according to claim 10, wherein said input terminal is connected via one of said voltage reduction circuits to a control electrode of one of said variable capacitance elements.

17. A voltage controlled oscillation circuit according to claim 10, wherein each of said variable capacitance elements comprises first variable capacitance connected in series with a second variable capacitance, and with the control electrode connected at a common connection of said first capacitance and said second capacitance.

18. A voltage controlled oscillation circuit according to claim 10, wherein said series connected voltage reduction circuits are connected at an input end to said input terminal and at an output end via a series resistor to a point of reference potential.

* * * * *